United States Patent [19]

Ohmi

[11] Patent Number: 4,897,171
[45] Date of Patent: Jan. 30, 1990

[54] WAFER SUSCEPTOR

[76] Inventor: Tadahiro Ohmi, 2-1-17-301, Komegabukuro, Sendai-shi, Miyagi-ken, Japan

[21] Appl. No.: 251,935

[22] Filed: Sep. 29, 1988

Related U.S. Application Data

[63] Continuation of Ser. No. 934,798, Nov. 25, 1986, abandoned.

[30] Foreign Application Priority Data

Nov. 26, 1985 [JP] Japan .................................. 60-265912

[51] Int. Cl.$^4$ .......................... B05C 11/14; C23F 1/02
[52] U.S. Cl. .................................... 204/298; 118/500;
156/345; 204/192.1; 414/222
[58] Field of Search .... 204/298 E, 298 EM, 298 MC,
204/192.1, 192.12, 192.31, 298 WH, 298 SC;
118/500, 504, 505; 156/345; 414/222, 225, 227

[56] References Cited

U.S. PATENT DOCUMENTS

| | | | |
|---|---|---|---|
| 4,384,918 | 5/1983 | Abe ................................. | 156/345 X |
| 4,399,016 | 8/1983 | Tsukada et al. ................ | 204/298 X |
| 4,595,452 | 6/1986 | Landau et al. ............ | 204/298 EM X |
| 4,657,617 | 4/1987 | Johnson et al. ......... | 204/298 EM X |
| 4,668,373 | 5/1987 | Rille et al. ..................... | 204/298 TS |

FOREIGN PATENT DOCUMENTS

| | | |
|---|---|---|
| 55-24941 | 2/1980 | Japan . |
| 56-29328 | 3/1981 | Japan . |
| 56-47570 | 4/1981 | Japan . |
| 57-50435 | 3/1982 | Japan . |
| 58-170016 | 10/1983 | Japan . |
| 58-170017 | 10/1983 | Japan . |
| 59-220928 | 12/1984 | Japan . |
| 60-63388 | 4/1985 | Japan . |
| 60-206137 | 10/1985 | Japan . |
| 61-127876 | 6/1986 | Japan . |
| 61-127877 | 6/1986 | Japan . |
| 61-130493 | 6/1986 | Japan . |
| 61-130494 | 6/1986 | Japan . |
| 61-133386 | 6/1986 | Japan . |
| 61-133387 | 6/1986 | Japan . |
| 61-139685 | 6/1986 | Japan . |
| 61-174634 | 8/1986 | Japan . |
| 61-235575 | 10/1986 | Japan . |
| 61-235576 | 10/1986 | Japan . |
| 61-192446 | 11/1986 | Japan . |
| 61-263125 | 11/1986 | Japan . |
| 61-266584 | 11/1986 | Japan . |
| 61-203541 | 12/1986 | Japan . |
| 61-203542 | 12/1986 | Japan . |
| 61-281881 | 12/1986 | Japan . |

Primary Examiner—Nam X. Nguyen
Attorney, Agent, or Firm—Oblon, Spivak, McClelland, Maier & Neustadt

[57] ABSTRACT

A wafer susceptor is disclosed. The wafer susceptor has: a first conductive electrode which includes its flat surface covered with a thin insulating film; a second conductive electrode which is electrically insulated from the first conductive electrode and is disposed so that the surface thereof is flush with the surface of the thin insulating film which covers the first conductive electrode; a means for imparting a specified electric potential to the second conductive electrode; and a means for applying a predetermined voltage between the first conductive electrode and the second conductive electrode. With this constitution, the wafer susceptor is capable of adsorbing a wafer by an electrostatic force and of regulating an electric potential of the wafer to a predetermined value in time of the wafer being adsorbed.

8 Claims, 4 Drawing Sheets

F I G. 5 (a)
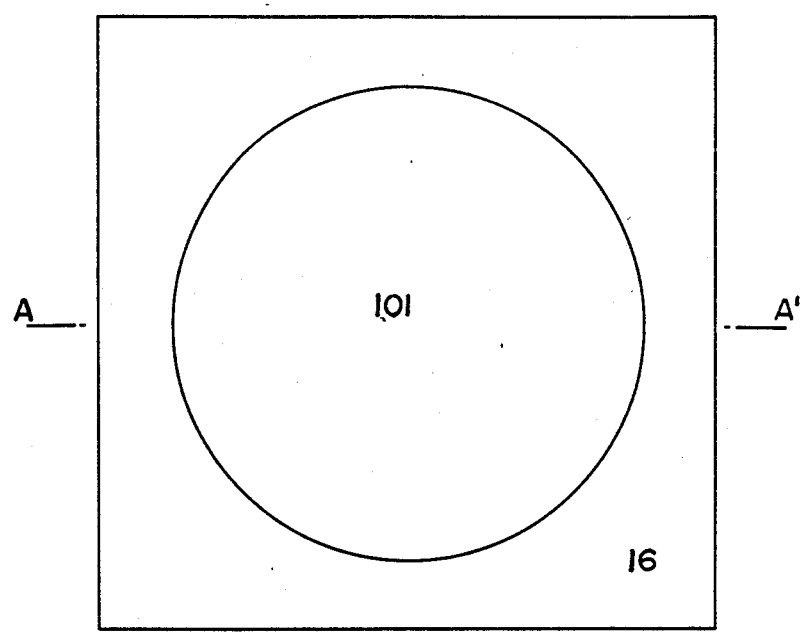
F I G. 5 (b)
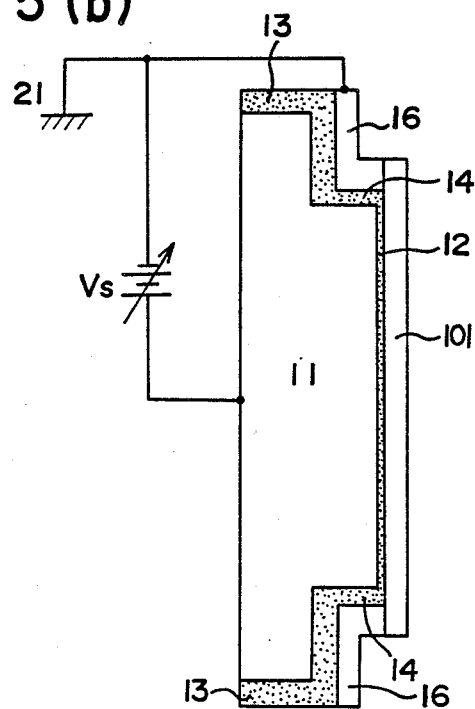

WAFER SUSCEPTOR

This application is a continuation of application Ser. No. 06/934,798, filed on Nov. 25, 1986, now abandoned.

BACKGROUND OF THE INVENTION

1. Field of the Invention

The present invention relates to a wafer susceptor designed for disposing a semiconductor wafer which susceptor is provided in a reaction chamber of a semiconductor manufacturing apparatus or the like.

2. Description of the Prior Art

There are utilized various kinds of methods of disposing a wafer upwards, perpendicularly or downwards in time of being subjected to the treatments based on the following techniques or a device. These techniques or the device involve a film forming device for forming thin films composed of multiple materials on the basis of a CVD (Chemical Vapor Deposition) technique, a plasma CVD technique, a sputtering technique and a bias sputtering technique, and further involve a reactive ion etching (RIE) technique, an ECR (Electron Cyclotron Resonance) etching technique and an impurity adding technique such as an ion implantation technique or the like. The wafer is disposed on a wafer susceptor, this largely depending on a method of mechanically supporting the circumferential portion of the wafer. Hence, it is a quite common method that an operator sets the wafer at a predetermined position by opening the reaction chamber wherein the wafer undergoes various kinds of treatments, or the operator sets the wafer on a wafer holder in a pre-chamber prepared before the reaction chamber and this wafer holder is transferred to the reaction chamber with the aid of a load lock mechanism (a wafer carrying device) in order to set it at the predetermined position. In such a method, however, inasmuch as the reaction chamber itself or the wafer holder is considerably suffers atmospheric pollution, a clean-process is far from being actualized. The importance of clean process for realizing submicron patterning in the future has fully been disclosed in the specification, titled "Apparatus For Treating Wafer", of Japanese Patent Application No. 211643/1985 which was made by the present inventors. However, a description relative to this will herein be made once again.

Advancement of an LSI technology is now being accelerated with amazing rapidity. In such circumstances, there has already been manufactured an LSI which makes use of a minute pattern of less than 1 μm. As a matter of fact it requires a manufacturing process invested with still more favorable controllability and high performance to produce the LSI of the above-mentioned submicron level, this process being less influenced by uncertain elements than other processes.

As one example, the lowering of temperature and a high selectivity process are exemplified. Chiefly, the lowering of temperature is needed for restraining re-diffusion of impurities within the semiconductor and for actualizing accurate impurity distribution. Especially, the lowering of temperature is effective both in restraining grain growth in various kinds of thin films (a semiconductor, metal and an insulating material) and in controlling interface reaction between substrate crystal and a thin film thereon and between the thin films. On the other hand, high selectivity among different materials is indispensable for etching or thin film deposition in fine patterning processes.

The most essential condition for fulfilling the lowering of temperature and the high selectivity process is that unnecesary gaseous components except the gaseous components required for the reaction are almost completely eliminated from the atmosphere in the reaction chamber where the process is proceeded. Videlicet, an ultra-clean process is the inevitable factor for actualizing the low-temperature process and the high selectivity process which are indispensable for manufacturing infinitesimally by small geometry LSIs.

The significance of the clean process will be described by exemplifying a few examples as follows:

(1) Silicon epitaxial growth:

$$SiH_4 \rightarrow Si + 2H_2 \tag{1}$$

$$SiH_2Cl_2 + H_2 \rightarrow Si + 2HC + H_2 \tag{2}$$

The epitaxial growth of silicon is effected by thermal decomposition (formula (1)) of silane ($SiH_4$) and by hydrogen reduction reaction (formula (2)) of dichlorosilane ($SiH_2Cl_2$).

However, if oxygen ($O_2$) or moisture content ($H_2O$) is present in the reactive atmosphere, the surface of a silicon substrate will be consecutively oxidized, thereby forming a thin film of $SiO_2$ on the surface. A high temperature is needed for removing the thin film of $SiO_2$ by evaporation or etching.

If the reactive atmosphere is extremely clean, the clean silicon surface can invariably be obtained. Surface migration of Si atoms adsorbed on the clean surface takes place intensively, thereby readily putting the atoms adsorbed on the surface into a normal lattice site and further obtaining the epitaxially grown layers with high quality and low temperature. Namely, it is feasible to decrease the process temperature in the clean atmosphere (2) Tungsten selective growth:

$$2WF_6 + 3Si \rightarrow 2W + 3SiF_4 \tag{3}$$

Tungsten (W) is selectively grown on the single-crystalline silicon (Si) or the polycrystalline silicon (Si) by employing a raw gas $WF_6$, this selective growth being progressed by Si substrate reduction reaction.

An oxide film or the like must not exist in an Si-W interface in order that the reaction expressed by the formula (3) is progressed; and as a matter of course, W itself must not contain the oxide film or the like. Si and W are highly oxidizable materials.

Consequently, as long as the reactive atmosphere contains $O_2$ and $H_2O$, the substrate reduction reaction shown in formula (3) never occurs. At the interface between Si and the metal which does not interpose an intermediate layer such as the oxide film or the like therebetween, Si-Si bonding is disconnected at an extremely low temperature by the shielding effect of the metal, whereby the Si atoms diffuse over the metal thin film surface along grain boundaries of polycrystalline metal. Subsequently, the substrate reduction reaction expressed by the formula (3) continues to occur.

It is quite natural that W should not be accumulated on the surfaces of, for instance, $SiO_2$ and $Si_3N_4$ except Si, as long as the substrate reduction reaction is adopted. That is, provided that the reactive atmosphere is clean, W is selectively acculumated on Si alone at a low temperature. As explained earlier, that the reactive atmosphere is clean makes both the lowering of process temperature and the high selctivity process possible.

For the purpose of making the reactive atmosphere clean, cleaness is strictly indispensable for all the systems such as a gas supply system ranging from a raw gas cylinder (or liquefied gas vessel hereinafter referred to as a gas cylinder) to the reaction chamber, the reaction chamber itself and a gas pumping system.

The principal conditions are enumerated as follows:

(1) The raw gas has as high purity as possible.

(2) In connection with the gas supply system, the reaction chamber and the discharging system, (a) an amount of outside leakage is decreased to its minimum, and no atmospheric pollution is present.

(b) gases released from a piping system and the tube wall of the reaction chamber are considerably low in quantity. Namely, the materials of which the piping system and the reaction chamber are composed do not contain any gaseous components. Simultaneously, the surface of the tube wall is sufficiently flat and includes no processed alterative layer, and adsorbed gas is considerably low in amount. Furthermore, there is equipped a device in which the inside of the reaction chamber and the inside of the gas supply piping system are so arraged as not to be exposed to the atmosphere.

(c) there exists no dead zone in which the gas stays.

(d) the number of particles which are to be produced is rendered as small as possible. Even if a movable mechanism is provided, sliding portions are, for preference, not formed in the gas supply system and the reaction chamber.

Some of the above-described necessary conditions can be fulfilled by management or operations. However, the occurrence of the particles in the movable system of the device is the very problem in constructing the mechanical system itself in the wafer carrying device, and its structure is important.

In this case, the wafer carrying mechanism which transfers the wafer to the reaction chamber is of particular importance. This wafer carrying mechanim requires a mechanism whereby the wafer is supported or held.

To cope with the aforementioned defects, there is developed a technology in which the wafer alone is transferred to the reaction chamber, and the wafer is adsorbed on the susceptor by dint of an electrostatic force. For example, the Reactive Ion Etching Device Hirie-100 made by Tokuda Mfg. Co., Ltd. has already been put into practical use. However, inasmuch as the structure is such that the overall surface of metal such as stainless-steel or the like is covered with an insulating material, the above-described etching device is attended with defects wherein the electric potential control of the adsorbed wafer loses certainty, and separation of the wafer from the susceptor is contingent on a mechanical means. Moreover, in the specification of the aforecited Japanese Patent No. 211643/1985 is disclosed an apparatus for carrying the wafer by electrically adsorbing it with the help of an electrostatic chuck provided between the reaction chamber and the pre-chamber.

SUMMARY OF THE INVENTION

Accordingly, it is a primary object of the present invention which obviates the above-described defects inherent in the conventional wafer susceptor to provide a wafer susceptor which is capable of adsorbing a wafer by dint of an electrostatic force and of regulating a electric potential of the wafer in time of its being held to a predetermined value.

To this end, according to one aspect of the invention, there is provided a wafer susceptor which includes: a first conductive electrode having a flat surface covered with a thin insulating film; a second conductive electrode electrically insulated from the first conductive electrode and disposed so that the surface thereof is as flush with the surface of foregoing thin insulating film as possible which covers the first conductive electrode; a means for imparting a specified electric potential to the second conductive electrode; and a means for applying a predetermined voltage between the first conductive electrode and the second conductive electrode.

With this constitution, it is feasible to arbitrarily dispose the wafer upwards, downwards, perpendicularly and so on in the reaction chamber and to electrically performs both adsorption and separation of the wafer. Furthermore, a potential of the wafer can be controlled in a discretionary manner when undergoing the treatment in the reaction chamber. On the occasion of the wafer being subjected to the treatment, an increase in temperature is a concomitant thereof in many cases. Therefore, the wafer is needed for being cooled off. In such a case, it is required that an adsorptive force of the wafer is several kg/cm$^2$ or more in order to obtain an effective cooling. Such an intensive force of adsorption can not be obtained at all by the method of meachanically supporting the wafer. In the wafer susceptor according to the present invention, however, the intensive force of adsorption can readily be gained by increasing the electric potential that is to be applied.

The wafer susceptor of the present invention is invested with characteristics in which the reaction chamber and a carry chamber can be adjusted to any one of a high pressure, a normal pressure, a moderately reduced pressure and a vacuum. Other objects and advantages of the invention will become apparent to those skilled in the art from the following description with reference to the accompanying drawings.

BRIEF DESCRIPTION OF THE DRAWINGS

FIG. 1(a) is a plan view of the wafer susceptor on which a wafer is adsorbed;

FIG. 1(b) is a sectional view taken substantially along the line A—A' of FIG. 1(a);

FIGS. 5(a), 5(b) in combination show a structure of the wafer susceptor of still another embodiment of the present invention.

FIG. 5(a) is a plan view of the wafer susceptor on which the wafer is adsorbed; and FIG. 5(b) is a sectional view taken substantially along the line A—A' of FIG. 5(a).

DETAILED DESCRIPTION OF THE PREFERRED EMBODIMENT

The present invention will hereinafter be described with reference to the accompanying drawings.

Figure 1A:
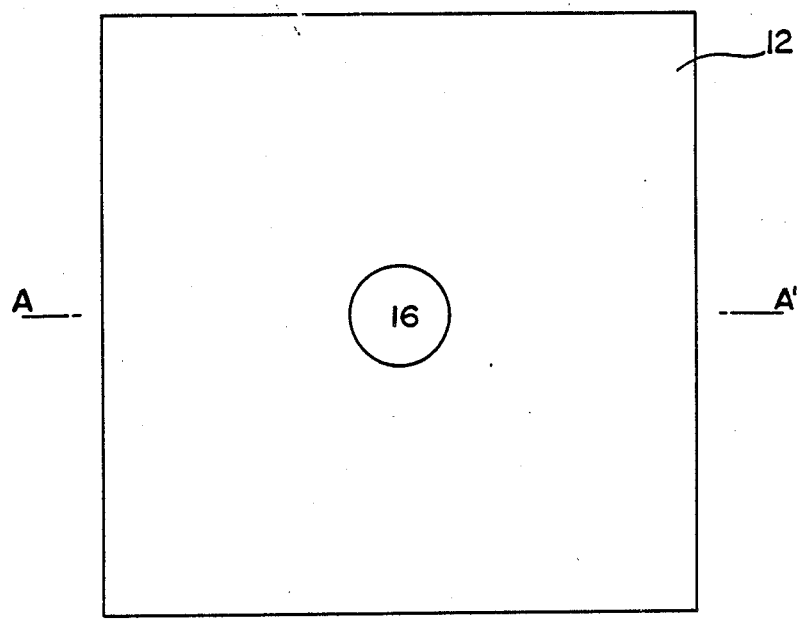
FIGS. 1(a), 1(b) in combination show a structure of a wafer susceptor of one embodiment of the present invention.
Figure 1B:
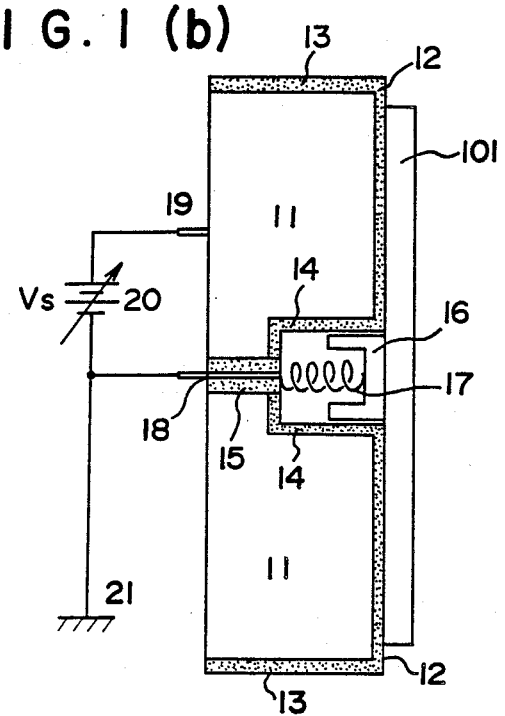

FIGS. 1(a), 1(b) show a structure of a wafer susceptor according to the present invention. FIG. 1(a) is a plan view of the wafer susceptor on which the wafer is adsorbed. FIG. 1(b) is a structural view in section taken substantially along the line A—A' of FIG. 1(a). The reference numeral 11 stands for a wafer susceptor body composed of metal such as Al, stainless-steel, Mo, Ti or the like or of conductive material such as polycrystalline silicon or the like. The numeral 12 designates a thin insulating film for covering the wafer susceptor surface which is formed of polyimide, silicone rubber, AlN, Al$_2$O$_3$, SiC or the like. 13 denotes an insulating film for covering the side surface of the susceptor body 11, and 14 represents another insulating film for insulating a portion between an electrode 16 and the susceptor body 11. 15 denotes an insulator for insulating a portion between the susceptor body 11 and a conductor 18 for imparting an electric potential (grounded point electric potential in FIG. 1) to the electrode 16 which partly constitutes the wafer susceptor. 17 stands for a spring (in this example, it simultaneously serves as the conductor for imparting a given electric potential to the electrode 16 for making the electrode 16 come in close contact with the wafer). 18 denotes a conductor for imparting an electric potential to the electrode 16, and 19 also stands for a conductor for imparting an electric potential to the susceptor body 11. 20 designates a power source, and 21 represents a grounded point. When setting the wafer electric potential to a predetermined value Vo, the grounded point 21 may serve as the power source Vo. The numeral 101 stands for a wafer adsorbed on the surface of the wafer susceptor.

In FIG. 1(a), the surface of the wafer susceptor assumes a square configuration. However, there will be no problem if it has a circular shape or others. Namely, the configuration may be determined according to the applications. The electrode 16 is provided at the central portion of the surface on which the wafer is adsorbed in FIG. 1. However, the electrode 16 may be disposed in any place. For instance, if the wafer susceptor is circular, the elecrode will be disposed along the outer periphery thereof in an annular configuration. Or, a plurality of the electrodes may, unlike the arrangement shown in FIG. 1, be so disposed at preset positions as to be dispersed over the adsorption surface.

Referring now to FIGS. 5(a), 5(b), there is shown an example in which the conductive eletrode 16 for imparting a given electric potential (electric potential of the grounding point this example, too) is annularly provided so that it comes in contact with the outer periphery of the wafer. In the example of FIG. 5, the wafer is grounded, and at the same time the electrode 16 disposed outside the wafer is also grounded. Hence, when viewing them from the surface-side, all the surfaces are kept at the same electric potential (ground potential in this example). Consequently, it is possible to surely obtain uniformity in the film formation by the ion implantation, reactive ion etching, or bias sputtering. Inasmuch as the principal portions save for the outer periphery of the wafer are adsorbed by dint of the uniform adsorptive force, the cooling effects of the wafer are intensive. In addition, there is a very favorable condition in the temperature control of the wafer, whereby the uniformity of various processes within the wafer surface is improved.

In the second place, the adhesive force of the wafer in the wafer susceptor according to the present invention will hereinafter be described. Let d denote the thickness of the insulating film 12, let $\epsilon$ designate dielectric constant and let S denote the area which is in contact with the wafer, the electrostatic capacitance Cs between the susceptor body 11 and the wafer 101 can approximately be expressed such as:

$$Cs = \epsilon S/d \qquad (4)$$

Figure 2:
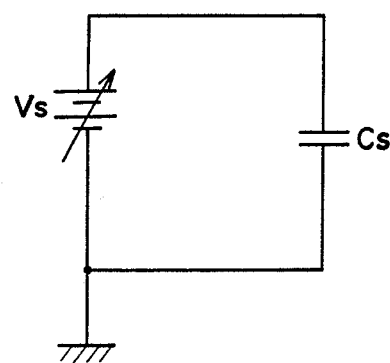
FIG. 2 is a circuit diagram showing an equivalent circuit when the wafer is adsorbed on the wafer susceptor relative to the embodiment of the present invention.

Even if the resistivity of the semiconductor wafer is as high as $10^8 \Omega\cdot cm$, its dielectric relaxation time $\tau d$ ($=\rho\epsilon s$ :$\epsilon s$ is the dielectric constant of the semiconductor) is $10^{-4}$ sec. Therefore, the semiconductor wafer can be deemed conductive in terms of direct current. Referring to FIG. 2, there is shown an equivalent circuit which has a state wherein the wafer is, as shown in FIG. 1(a), adsorbed on the surface of the susceptor relative to the embodiment of the present invention. In the example illustrated in FIG. 1(b), the semiconductor wafer is substantially grounded because of the electrode 16 being brought into close contact therewith. Hence, a power source voltage Vs is for the most part applied between the semiconductor wafer 101 and the wafer susceptor body 11. At this time, a force F (Newton) by which the wafer is adsorbed is given by:

$$F = \frac{1}{2} \frac{\epsilon S V_s^2}{d^2} \qquad (5)$$

Table 1 shows a size of the wafer, a mass M (kg) and a weight f (Newton) when the wafer invloves an Si wafer. Volume in Table 1 is expressed in gram. However, f=MG (G=9.8 m/sec$^2$). A condition under which the wafer is adsorbed is given by:

$$\frac{1}{2} \frac{\epsilon S V_s^2}{d^2} = MG \qquad (6)$$

The unit is, however, based on MSK unit element. For example, assuming that the specific dielectric constant of the insulating film 12 be 2.5 (equivalent to polyimide resin or the like), $d = 10/\mu m = 1 \times 10^{-5}$, and M=100 gram=0.1 Kg, the following equation is established.

$$SV_s^2 = 8.85 \ (m^2 \cdot V^2) \qquad (7)$$

If the specific dielectric constant becomes a value of approximately 10 which is equivalent to Al$_2$O$_3$, AlN or the like, the right side of the formula (7) is 2.21. For instance, given that an area S obtained when the wafer and the wafer susceptor body 11 are disposed vis-à-vis with each other while interposing the insulating film 12 therebetween is 10 cm$^2 = 1 \times 10^{-3}$m$^2$, the result is Vs=94 V. Namely, if S=10 cm$^2$, the wafer having a weight of 100 g can be adsorbed under a voltage of 94 V. As a matter of course, this is the required minimum value. In fact, the wafer is adsorbed by applying 200 V or 300 V.

The force alone that is necessary for adsorbing the wafer has so far been described. However, still more intensive force of adsorption is required in order to regulate the temperature of the wafer to the predetermined value. For instance, in the case of adopting the wafer susceptor designed for the ion implantation, bias sputtering, ECR (Electron Cyclotron Resonance) deposition, ECR etching and reactive ion etching, the direct current runs through the wafer and it is thereby heated, while being subjected to treatments such as the ion implantation, bias sputtering, ECR deposition, ECR etching and reactive ion etching. Consequently, a means for making the wafer come in close contact with the wafer susceptor by sufficiently intensive force of adsorption and a means for cooling it are needed. For example, in order to prevent the deterioration of resist patterns formed on the wafer during ion implantation, adequate cooling operation is required; and the adhesive force of the wafer on the wafer susceptor needs a force of, for example, 4.5 Kg/cm$^2$=4.5 ×4.5×10$^4$ Kg/m$^2$ or more. This strong adhesive force can not be obtained at all by the conventional technology in which the vicinal portion of the wafer is mechanically pressed. Far from that, the wafer is broken. The power source voltage Vs needed for gaining the adhesive force of 4.5 Kg/cm$^2$=4.5×10$^4$ Kg/m$^2$ per unit area is obtained by the formula (6) as follows:

$$Vs = d\left(\frac{2MG}{\epsilon}\right)^{1/2}$$

If d=10 μm=1×10$^{-5}$m, ε/εo=2.5 (εo:permittivity of free space), M=4.5×10$^4$ Kg and G=9.8 m/sec$^2$, Vs=1,996 V is obtained. If the dielectric constant ε/εo of the insulating film is 10 or thereabouts, an equation of Vs=1,000 V is established. It is quite easy to apply such a voltage on the wafer susceptor. It is not until the electrostatic force adsorption type wafer susceptor according to the present invention is employed that the temperature of the wafer is adequately controlled when undergoing various kinds of treatments.

The area of the conductive electrode 16, the area S which detemines a size of a condenser Cs and the thickness d of the insulating film may be determined in accordance with the individual purposes or the required intensity of the adhesive force on the basis of the formula (6).

In the wafer susceptor relative to the embodiment of the present invention, the conductive electrode 16 is directly brought into contact with the wafer. According to the example shown in FIG. 1(b), since the electrode 16 is kept at the ground potential, even in the process such as the ion impalantation, bias sputtering, ECR deposition and ECR etching wherein the direct current flows, the electric charge that has flown in flows out to the ground at once, so that the wafer is almost free from charging-up. Even if the conductive electrode 16 is kept not at the ground potential but at the preset electric potential, the situation is the same. The conductive electrode 16 is rendered proximate to the wafer susceptor body enough to come in close contact with the wafer. The strength of the spring 17 may be determined in proportion to the intensity of the adhesive force of the wafer. It is to be noted that the electrode 16 can be brought into close contact with the wafer not only by dint of the spring but also by employing an electrostrictive substance which is stretchable by dint of voltage.

A wafer susceptor apparatus of the present invention which can prevent charging of wafer has a feature that it can be applied very effectively not only to a semiconductor device manufacturing apparatus but also to the photoelectro spectrometric technology such as ESCA (Electron Spectroscopy for Chemical Analysis), etc.

ESCA is an analysis within a substance by analysing energy of electrons emitted by photoelectron effect from a sample when it is irradiated with X-ray. Since a sample emits electrons, it is certainly charged positively, resulting in variation of potential. Therefore, it has been impossible to measure the absolute energy of electrons emitted from the sample. However, the wafer susceptor of the present invention accurately determines potential of wafer, for example, by the electrode 16 of FIG. 1(b) and accordingly does not generate the problem as described above. Namely, it has become possible to measure accurately the absolute value of energy of photoelectrons by utlizing the wafer susceptor of the present invention as the wafer stage of ESCA.

The power source voltage Vs is so applied to the electrode 16 as to be positive in FIG. 1(b). Where impurities are added to the rear surface of the wafer with high concentration, the positive and negative states of the voltage Vs exert almost no influence on the situation. However, in the case of the wafer being defined as an n-type substrate, it is preferable that the voltage Vs is positive. While on the other hand, it involves a p-type wafer, it is desirable that the voltage Vs is negative. Videlicet, in a state wherein the wafer is adsorbed on the wafer susceptor, an accumulated layer of carriers is present on the rear surface (the surface coming in contact with the insulating film 12) of the wafer. In this case, the gap between the wafer 101 and the wafer susceptor body 11 is precisely determined by the thickness d of the insulating film 12; the capacitance Cs between the wafer and the wafer susceptor body increases; and greater adhesive force is obtained as compared to the case of the same source voltage with opposite polarity.

For the sake of maintaining the temperature of the wafer constant by a cooling or heating operation, the rear surface of the wafer susceptor may be cooled off or heated while causing the wafer to be adsorbed on the wafer susceptor by adequately intensive force. It is taken for granted that a cooling efficiency can be increased by providing a passage through which a cooling liquid flows within the wafer susceptor body.

The wafer susceptor with the above-described constitution is provided in the reaction chamber, this susceptor being equipped with a required number of wafers that are to be set in the reaction chamber. A mode of setting the wafer susceptors is variable; that is, they may be disposed on a roughly flat surface, or a required number of the wafer susceptors may be set on the respective surfaces of a polyhedron.

Figure 3:
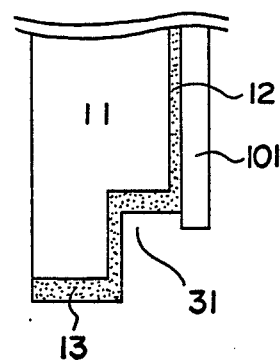
FIGS. 3, 4 are sectional views each showing the wafer susceptor of another embodiment of the present invention.
Figure 4:
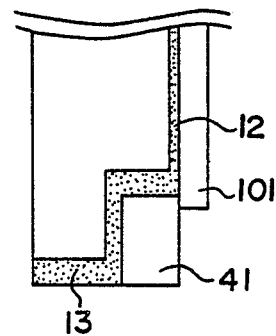

In such processing devices in which the direct current flows as an ion implantion device, a bias sputtering device, an ECR deposition device and an ECR etching device, there is sometimes declined the surface-inside uniformity in regard to an amount of added impurities, a degree of etching or a degree of film formation, inasmuch as the insulating film 12 provided outside the wafer adsorbed in the manner shown in FIG. 1(b) is electrified. In such a case, a step may be formed on the surface of the wafer susceptor so that the step edge comes underneath the wafer as shown in FIG. 3. Referring to FIG. 3, there is shown only the circumferential portion of the wafer. As compared with FIG. 1(b), a stage 31 is newly provided in the wafer susceptor. Furthermore, if the outside of the outer periphery of the wafer is kept at the same electric potential as that of the wafer, the stage 31 shown in FIG. 3 is, as illustrated in FIG. 4, provided with a metallic electrode 41.; and its connection is so made as to have the same electric potential as that of the conductive electrode 16.

Figure 6:
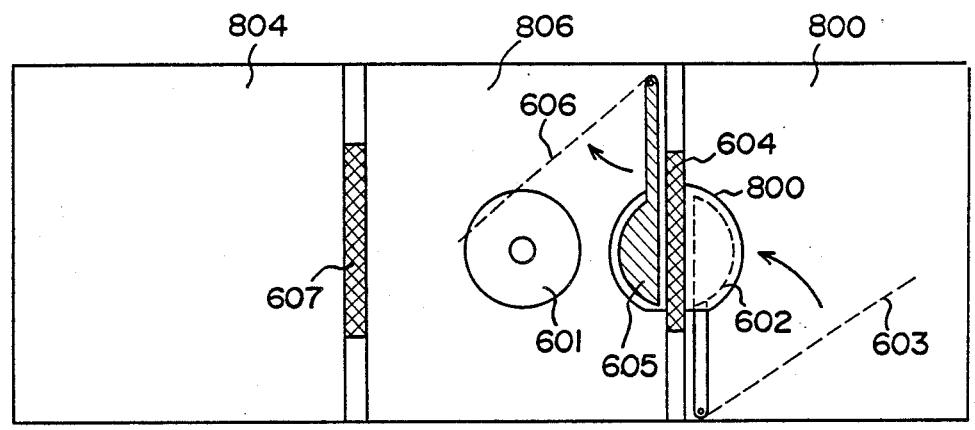
FIGS. 6(a) and 6(b) in combination show the structure of a high speed load lock mechanism including the wafer susceptor apparatus of the present invention.
Figure 6:
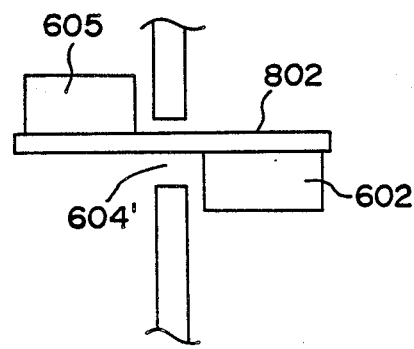

Moreover, the present invention is indispensable technology also for high speed wafer sheet processing apparatus which is considered to become a typical apparatus of the semiconductor manufacturing apparatus in future. Namely, the wafer sheet processing apparatus which processes wafers sheet by sheet sequentially has a problem of the throughput of wafer and is required to have the processing ability, for example, of 60 sheets or more of wafer per hour as the apparatus which is truely put into the practical use. In other words, a sheet of wafer must be processed within a minute and therefore it is required, for this purpose, that a film forming or etching rate is about 2 $\mu$m/min and a time required for putting into or out the wafer into or from a reaction chamber 806 is about 5 sec at the most. Since a large amount of heat is generated during film forming or etching in the rate of 2 $\mu$m/min, it is important particularly to effectively radiate the heat. For example, it is better to use an insulator having thermal conductivity as large as that of aluminum like AlN and SiC as an insulation film (12 in FIG. 2(b)) to be used for wafer susceptor. Moreover, loading or unloading of wafer can be realized within 5 seconds by employing, for example, a high speed wafer carrying system as shown in FIG. 6. FIG. 6 is an example of a high speed load lock mechanism to which the wafer susceptor apparatus 601 of the present invention is applied. FIG. 6(a) is a schematic view from the upper side of wafer. In the wafer loading chamber 800, the rear surface of wafer is held by the wafer holder 602 of the electrostatic attracting system and the wafer 802 is carried to the aperture of gate valve 604 from the position 603 for loading or unloading of wafer 800. FIG. 6B is a sectional view thereof and schematically illustrates only the part near the aperture 604' of gate valve. Here, the wafer holder 602 may be the same in the shape as the wafer susceptor of the present invention and it attracts only a half of wafer and only the left half of wafer is pushed to the side of reaction chamber from the aperture 604' of gate valve. The wafer holder 605 within the chamber holds the wafer 800 from the upper surface and the wafer 800 is carried up to the susceptor 601 by moving the arm to the position 606. The susceptor 601 may be that shown in FIG. 1(b), for example. In addition, it is desired that the holder 605 holds only the left half of the wafer from the upper surface of wafer and particularly holds only the periphery of wafer because it is in contact with the upper surface of wafer. It is also better that the holder has the same structure as that of the wafer susceptor of the present invention. The wafer having completed the processings while it it held by the susceptor 601 is again carried to the wafer unloading chamber 804 through the aperture of gate valve 607 by the mechanism (not illustrated here) similar to 605 and 602. Even in application to such high speed carrying of wafer, the wafer susceptor 601 of the present invention which can attract the wafer with powerful electrical force without using a mechanical force plays a very important role. Of course it is possible to use the structure same as the susceptor of the present invention, but it is also possible to use other types, for example, those comprising two conductive electrodes covered with an insulation film.

The gate valves 604, 607 used in the present invention must be gated at a high speed for the high speed wafer transfer. For example, the gating time must be about 0.5 second. The size of gate valve is enough when it corresponds to only a small size slit.

The wafer susceptor according to the present invention yields the following effects. In this wafer susceptor, the wafer is adsorbed by dint of the electrostatic force and hence it is feasible to arbitrarily dispose the wafer upwards, laterally, downwards and so on in the reaction chamber. What's more, even in the process where the direct current flows, the electric charge which flows into the wafer can immediately be made to flow out. It is possible to restrain the problem of the electrification caused by the direct current and to maintain the wafer at the specified electric potential, thereby enhancing the reliability and reproducibility of the process greatly. In addition to these effects, it is possible to readily obtain an adhesive force between the wafer and the wafer susceptor as large as several Kg/cm$^2$ or more, resulting in an excellent thermal conduction between the wafer and the wafer susceptor and thereby the precise temperature control of the wafer. The wafer susceptor, endued with many characteristics, of the present invention strikingly improves the performance of the semiconductor manufacturing apparatus.

The description so far made is centered on the semiconductor wafer, however, the wafer susceptor according to the present invention can be applied not only to the semiconductor wafer but also to any type of wafers made of conductive materials.

TABLE 1

| Mass and Weight of Si Wafer | | | |
|---|---|---|---|
| 2R | t | M | f |
| 2" 5.08 × 10$^{-2}$ m | 3 × 10$^{-4}$ m | 1.41 g | 1.39 × 10$^{-2}$ N |
| 4" 1.016 × 10$^{-2}$ m | 4 × 10$^{-4}$ m | 7.54 g | 7.39 × 10$^{-2}$ N |
| 6" 1.542 × 10$^{-2}$ m | 5 × 10$^{-4}$ m | 21.22 g | 2.08 × 10$^{-1}$ N |
| 8" 2.032 × 10$^{-2}$ m | 6 × 10$^{-4}$ m | 45.27 g | 4.44 × 10$^{-1}$ N |

What is claimed is:

1. A wafer susceptor comprising:
    a conductive susceptor body, having a recessed portion and a hole connecting said recessed portion with a rear surface, and being covered by an insulating film to form a wafer receiving surface,
    a conductor body electrically insulated from said susceptor body and inserted into said recessed portion so as to be movable within said hole and so that it becomes flat and flush with said wafer receiving surface and in electrical contact with said wafer,
    means for resiliently urging said conductor body towards said wafer,
    a first lead wire electrically connected with said conductor body and said wafer through said hole,
    a second lead wire electrically connected with said wafer susceptor body, and
    a means to apply a specified voltage between said first lead wire and said second lead wire, whereby said wafer is adsorbed on the susceptor by electrostatic forces.

2. A wafer susceptor as set forth in claim 1, wherein said conductor body consists of an electrostrictive substance.

3. A wafer susceptor as set forth in claim 1, wherein said means for resiliently urging is a spring provided between said conductor body and said first lead wire.

4. A wafer susceptor as set forth in claim 1, wherein a means is provided to maintain said conductor body at the specified potential.

5. A wafer susceptor as set forth in claim 1, wherein the outer periphery of the conductor body is provided with a graded step.

6. A wafer susceptor as set forth in claim 5, wherein a metal electrode is furnished on said graded step, said metal electrode and said first lead wire are electrically connected, and said metal electrode and said first lead wire are maintained at the same potential.

7. A high speed wafer carrying system which comprises a wafer carry-into chamber, a reaction chamber in which etching treatment is conducted for a wafer, a wafer carry-out chamber, a first gate valve for opening and shutting the route between the wafer carry-into chamber and the reaction chamber, a second gate valve for opening and shutting the route between the reaction chamber and the wafer-carry-out chamber, and further, the wafer carry-into chamber of which includes a first wafer holder for carrying a wafer from its loading position to the first gate valve;

the reaction chamber of which comprises a wafer susceptor for holding a wafer during conducting etching treatment for it, a second wafer holder for carrying a wafer from the first gate valve to the wafer susceptor, and a third holder for carrying a wafer from the wafer susceptor to the second gate valve, the wafer carry-out chamber of which includes a fourth holder for carrying a wafer from the second gate valve to its unloading position;

said wafer susceptor of the reaction chamber of which consists of:

a conductive susceptor body, having a recessed portion and a hole connecting said recessed portion with a rear surface, and being covered by an insulating film to form a wafer receiving surface, a conductor body electrically insulated from said susceptor body and inserted into said recessed portion so as to be movable within said hole and so that it becomes flat and flush with said wafer receiving surface and in electrical contact with said wafer, means for resiliently urging said conductor body towards said wafer, a first lead wire electrically connected with said conductor body and said wafer through said hole, a second lead wire electrically connected with said wafer susceptor body, and a means to apply a specified voltage between said first lead wire and said second lead wire, whereby said wafer is adsorbed on the susceptor by electrostatic forces.

8. A high speed carrying system according to claim 7, wherein said first through fourth wafer holders each comprising:

a conductive susceptor body, having a recessed portion at the center and a hole connecting said recessed portion with a rear surface, and being covered by an insulating film to form a wafer receiving surface, a conductor body electrically insulated from said susceptor body and inserted movably into said recessed portion so that it becomes flat and flush with said wafer receiving surface, a first lead wire electrically connected with said conductor body through said hole, a second lead wire electrically connected with said wafer susceptor body, and a means to apply a specified voltage between said first lead wire and said second lead wire, whereby said wafer is adsorbed on the susceptor by electrostatic forces.

* * * * *